United States Patent [19]

Colombo et al.

[11] Patent Number: 4,712,127
[45] Date of Patent: Dec. 8, 1987

[54] HIGH RELIABILITY METAL AND RESIN CONTAINER FOR A SEMICONDUCTOR DEVICE

[75] Inventors: Piero Colombo, Monza; Marino Cellai, Bresso; Carlo Cognetti de Martiis, Milan, all of Italy

[73] Assignee: SGS-ATES Componenti Elettronici SpA, Milan, Italy

[21] Appl. No.: 556,159

[22] Filed: Nov. 29, 1983

[30] Foreign Application Priority Data

Dec. 1, 1982 [IT]  Italy ................................ 24533 A/82

[51] Int. Cl.[4] ............................................ H01L 23/12
[52] U.S. Cl. ........................................ 357/72; 357/74; 357/81
[58] Field of Search .................... 357/81, 74, 72, 70

[56] References Cited

U.S. PATENT DOCUMENTS

| | | | |
|---|---|---|---|
| 3,763,403 | 10/1973 | Lootens | 357/74 |
| 4,132,856 | 6/1979 | Hutchinson et al. | 357/72 |
| 4,190,735 | 2/1980 | Checki, Jr. | 357/74 |
| 4,270,138 | 5/1981 | Desmond | 357/81 |

FOREIGN PATENT DOCUMENTS

| | | | |
|---|---|---|---|
| 0004670 | 1/1977 | Japan | 357/81 C |
| 0043676 | 4/1979 | Japan | 357/81 |
| 0113251 | 9/1979 | Japan | 357/81 C |
| 0040263 | 4/1981 | Japan | 357/74 |

*Primary Examiner*—James W. Davie
*Attorney, Agent, or Firm*—Wenderoth, Lind & Ponack

[57] ABSTRACT

A container for a semiconductor device has a metal plate and a body of synthetic resin which encapsulates a part of the plate, keeping a large surface thereof exposed. In the area separating the part encapsulated within the body of resin and the part without the resin, the plate has two opposed side notches and at least one groove connecting them.

4 Claims, 4 Drawing Figures

HIGH RELIABILITY METAL AND RESIN CONTAINER FOR A SEMICONDUCTOR DEVICE

BACKGROUND OF THE INVENTION

The present invention relates to containers for semiconductor devices, more particularly to plastic containers having a metal part and a part of synthetic resin.

This type of container is known under the standardized designation TO-220. It comprises a metal plate which is partially encapsulated within a body of synthetic resin so as to keep a large surface thereof exposed. One or more semiconductor element chips which constitute the active part of the device are affixed to the surface of the plate so as to be in intimate contact therewith, thereby enabling the heat generated by the chips to be dissipated externally during the operation thereof. The part of the plate not encapsulated within the body of resin has a through-hole which enables it to be attached by means of a suitable screw to an external heat dissipator in such a way that the larger surface of the plate without resin is in intimate contact with the heat dissipator.

Rigid metal conductors acting as conducting wires for the device are connected to metallized areas of the semiconductor element chips by means of thin metal wires and they, too, are partially encapsulated within the body of resin.

The above-described type of prior art containers, while they have many advantages over other containers of a different construction, such as, for example, the type TO-3 metal containers, do not ensure an equally satisfactory resistance to mechanical stresses in every application.

This drawback, which involves a possible loss of the hermeticity of the container and, thereby, the formation of paths for external agents that are harmful to the active elements of the device, is in part attributable to the fact that, because of the different coefficients of thermal expansion of the metal and the resin, the interface surfaces of contact between the two materials have a tendency to slip on each other when there is a change of temperature, so that the contact between the two materials is not perfect everywhere due to an inadequate mechanical bonding of the body of resin to the metal plate due to deformations that may occur, under thermal stress, of the plate.

It may also be assumed that, immediately after the hardening of the resin body when the bonding of the resin to the plate and the contact between resin and metal are insufficient, the mechanical hermeticity of the container is due only to the bonding of the resin to the semiconductor material of the chips.

Therefore, both during the fabrication steps in the production process following the plastic encapsulation of the container and at the time that the device is being attached to the heat dissipator by the user, there is the danger that the semiconductor chips will be subjected to such mechanical stresses as to cause them to be damaged.

A number of solutions have been proposed in the prior art.

For example, the use of an intermediate layer of a material with good bonding properties both to the resin and to the metal and with a high elasticity coefficient has been proposed, so that the different expansions of the metal plate and of the resin body are compensated for and the stresses to which the semiconductor chips are subjected to are reduced.

The use of brackets, grooves or through-holes on the metal plate has also been proposed with the object of improving the mechanical bonding of the resin body.

However, these solutions do not sufficiently limit the transmission of the mechanical stresses to the semiconductor chips, particularly when the container is attached to dissipators which are not perfectly flat.

SUMMARY OF THE INVENTION

The primary object of the invention is to provide a container of the type described above which is more reliable, from the mechanical point of view, than the prior art containers and which provides better protection to the active part of the device contained therein from mechanical stresses.

This object is achieved by making use of a container of the type defined and characterized in the appended claims.

BRIEF DESCRIPTION OF THE DRAWINGS

For a more complete understanding of the present invention, reference is now made to the following detailed description given solely by way of non-limitative example taken in conjunction with the accompanying drawing, in which.

Like reference characters designate the same or similar parts throughout the several views.

DESCRIPTION OF THE PREFERRED EMBODIMENT

Figure 1:
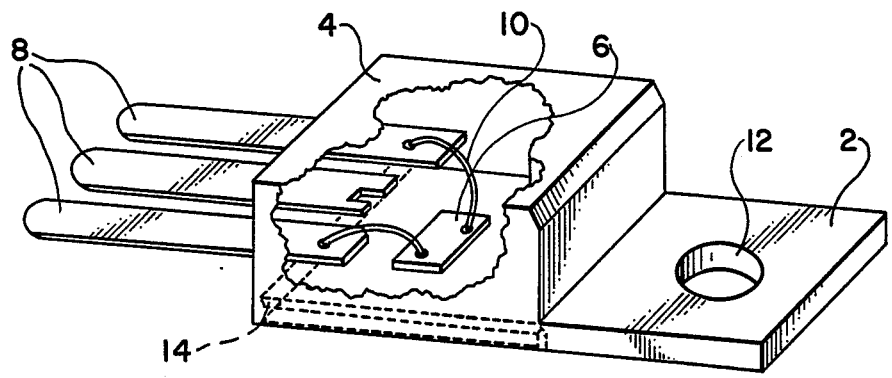
FIG. 1 is a perspective and enlarged view of a TO-220 type container.

Now, referring to FIG. 1, a TO-220 type container is shown. The container comprises a metal plate 2 having a part encapsulated within a body of synthetic resin 4 which, for example, is obtained by injection-molding an epoxy resin in a suitable mold.

A chip 6 of appropriately processed semiconductor material constituting the active part of the device is attached (e.g., by brazing) to the metal plate 2. Metal terminals 8 (three are shown in the figures) are partially encapsulated within the resin body 4 and are electrically connected to chip 6 by means of contact wires 10.

A through-hole 12 is provided in the metal plate 2 to enable the device to be fixed to a suitable external dissipator.

A rib 14 along a part of the edges of the plate (e.g., obtained by stamping) facilitates the bonding of the resin body to the metal plate.

Figure 2:
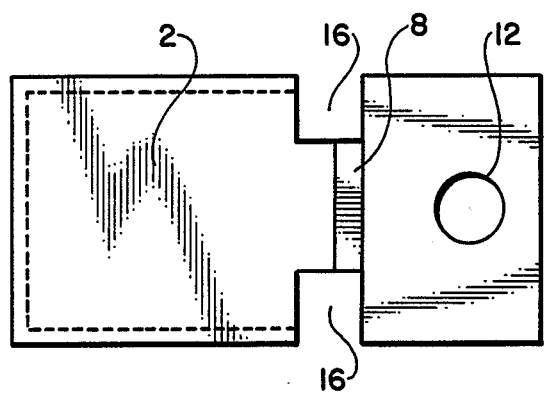
FIG. 2 is a top plan view of a metal plate of a container embodying the invention.

According to the present invention, as illustrated in FIG. 2, the plate has, in the area separating the metal part contained within the resin and the part which is external to the resin, two opposed side notches 16 and at least one groove 18 which connects them.

Figure 3:
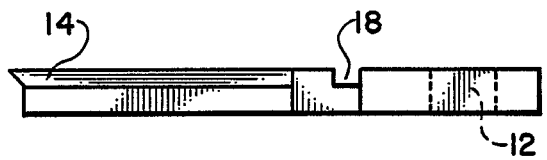
FIG. 3 depicts a side view of the plate illustrated in FIG. 2.

In the practical embodiment illustrated in FIGS. 2 and 3, the parts of notches 16 follow a rectangular route starting from the edge of the plate and are at right angles to the larger surfaces of the plate. The groove walls follow a straight path and are parallel to each other and at right angles to the plane of the plate.

Groove wall 18 and the walls of the notches 16 which are closest to the through hole 12 are on the same plane.

In the preferred embodiment of the present invention, this plane forms the boundary between the part of the plate encapsulated within the resin and the part which is external to the resin, so that any deformations of the exposed portion of the plate will not cause the resin body to detach from the plate.

According to a distinctive feature of the present invention, the groove is made by a milling operation, whereas the side notches are made by a single shearing operation. In other embodiments, however, the groove can also be obtained by stamping and the notches by milling.

The invention also provides for the possiblity of shaping the groove and the side notches in such a way that their side walls are undercut relative to the surface of the metal plate to which the semiconductor chips are attached.

The groove and the notches permit a better mechanical bonding of the resin body to the plate than that obtained with the rib 14.

The main function of groove 18 and the notches 16, however, is to reduce the mechanical resistance of the metal plate in the area separating the part encapsulated within the resin and the part which is external to the resin. In this way, harmful stresses caused by mechanical actions on the part of the metal not encapsulated within the resin are no longer transmitted to the semiconductor chips forming the active part of the device. Indeed, these stresses, e.g., those caused by the affixing of the devices to a heat dissipator that is not completely flat, instead of being transmitted to the chip, are absorbed by elastic or plastic deformations in said area with reduced mechanical resistance.

The groove 18 is preferably made by a milling operation, because such an operation confers properties of a reduced mechanical resistance upon the material of the walls and of the bottom.

The physical dimensions of the notches and of the groove are calculated in accordance with the highest possible stresses to be absorbed and are dependent upon the power dissipated by the device during its operation, because, even in the area of the groove and of the notches, the metal plate must maintain an adequate overall thermal conductivity in order to be able to dissipate the heat into the atmosphere. For example, tests have shown that for a surface of the external support into which the device is screwed and in a standard device having a fillet of 100 μm, the groove in the plate, must have a length not exceeding 6 mm and a depth equal to at least ⅓ of the thickness of the metal plate.

It is important to note that the formation of side notches 16 does not require machine work in addition to that normally required for fabricating the usual type of metal plate 2, because they can be obtained with the same plate shearing operation.

The formation of the groove on an industrial basis is simple and inexpensive, because the necessary milling operation can be carried out directly on the metal plate from which the individual plates 2 are subsequently sheared. Therefore, it may consist of one simple milling operation common to several plates.

Figure 4:
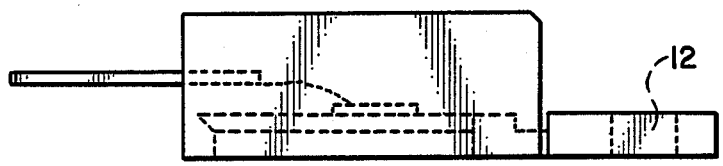
FIG. 4 depicts the plate of FIG. 3 after encapsulation.

FIG. 4 illustrates the plate of FIG. 3 after encapsulation. It, of course, externally appears to be identical to the Prior Art device of FIG. 1 but has the improved mechanical characteristics afforded by the present invention.

While the present invention has been disclosed with particular reference to a single embodiment thereof, it is readily apparent that numerous variations are possible without departing from the essential spirit of the invention. For example, a plurality of grooves may be provided on one or on both exposed surfaces of the plate. The border between the resin body and the exposed portion of the plate may also be modified as required. Finally, a section with lesser machanical strength may also be obtained by mechanical, physical or chemical means without any groove.

We claim:

1. A container for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches.

2. A container as recited in claim 1, wherein said groove has at least one portion of at least one wall thereof which is undercut.

3. A container as recited in claim 1, wherein said side notches have at least one portion of their internal walls undercut relative to a surface of said plate which is partially encapsulated with resin.

4. A container as recited in claim 1, wherein a surface, which is opposite to said body of synthetic resin, of the internal walls of each of said side notches, is substantially a plane surface, which forms an angle which is not greater than a right angle with the plane of said surface of said plate which is partially covered by said synthetic resin, such that said body of synthetic resin projects into said two opposed side notches to the limit of said plane surface opposite to said body of synthetic resin and wholly fills said notches.

* * * * *

REEXAMINATION CERTIFICATE (3181st)

United States Patent [19]
Colombo et al.

[11] B1 4,712,127
[45] Certificate Issued May 6, 1997

[54] HIGH RELIABILITY METAL AND RESIN CONTAINER FOR A SEMICONDUCTOR DEVICE

[75] Inventors: Piero Colombo, Monza; Marino Cellai, Bresso; Carlo Cognetti de Martiis, Milan, all of Italy

[73] Assignee: SGS-Thomson Microelectronics, Inc., Carrolton, Tex.

Reexamination Requests:
No. 90/003,727, Feb. 16, 1995
No. 90/004,067, Dec. 27, 1995

Reexamination Certificate for:
Patent No.: 4,712,127
Issued: Dec. 8, 1987
Appl. No.: 556,159
Filed: Nov. 29, 1983

[30] Foreign Application Priority Data

Dec. 1, 1982 [IT] Italy ................. 24533/82

[51] Int. Cl.$^6$ ............................ H01L 23/12
[52] U.S. Cl. ............................ 257/796
[58] Field of Search .............. 257/787, 788, 257/796, 798, 782, 667, 432, 433, 184, 21, 52, 100

[56] References Cited

U.S. PATENT DOCUMENTS

| | | | |
|---|---|---|---|
| 3,742,599 | 7/1973 | Desmond et al. | 257/796 |
| 3,763,403 | 10/1973 | Lootens | 257/705 |
| 4,059,810 | 11/1977 | Paletto | 330/65 |
| 4,125,740 | 11/1978 | Paletto | 330/65 |
| 4,132,856 | 1/1979 | Hutchison et al. | 174/52.2 |
| 4,190,735 | 2/1980 | Checki, Jr. | 174/52 FP |
| 4,270,138 | 5/1981 | Desmond | 257/796 |

FOREIGN PATENT DOCUMENTS

| | | | |
|---|---|---|---|
| 97518 | 5/1973 | Germany | 257/796 X |
| 2919540 | 11/1979 | Germany | 257/796 X |
| 3128123 | 3/1982 | Germany | 257/796 X |
| 45-7375 | 4/1970 | Japan | 257/796 X |
| 49-11862 | 2/1974 | Japan | 257/796 X |
| 50-107865 | 8/1975 | Japan | 257/796 X |
| 51-15858 | 2/1976 | Japan | 257/796 X |
| 52-4670 | 1/1977 | Japan | 257/796 X |
| 52-129379 | 10/1977 | Japan | 257/796 X |
| 53-7210 | 1/1978 | Japan | 257/796 X |
| 54-43676 | 4/1979 | Japan | 257/796 X |
| 54-113251 | 9/1979 | Japan | 257/796 X |
| 55-35809 | 8/1980 | Japan | 257/796 X |
| 56-24151 | 3/1981 | Japan | 257/796 X |
| 56-40263 | 4/1981 | Japan | 257/796 X |
| 57-45960 | 3/1982 | Japan | 257/796 X |
| 57-64954 | 4/1982 | Japan | 257/796 X |
| 57-88753 | 6/1982 | Japan | 257/796 X |
| 60-130129 | 7/1985 | Japan | 257/796 X |
| 2021315 | 11/1979 | United Kingdom | 257/796 X |
| 2043343 | 10/1980 | United Kingdom | 257/796 X |
| 2096394 | 10/1982 | United Kingdom | 257/796 X |

OTHER PUBLICATIONS

Semiconductor Materials & Processes, pp. 9–10 (Jan. 1982).
Search Report, United Kingdom, No. 32106/83, dated Jan. 27, 1984.
Search Report, France, No. FR 83 19 095, dated Feb. 19, 1985.

*Primary Examiner*—Brian Healy

[57] ABSTRACT

A container for a semiconductor device has a metal plate and a body of synthetic resin which encapsulates a part of the plate, keeping a large surface thereof exposed. In the area separating the part encapsulated within the body of resin and the part without the resin, the plate has two opposed side notches and at least one groove connecting them.

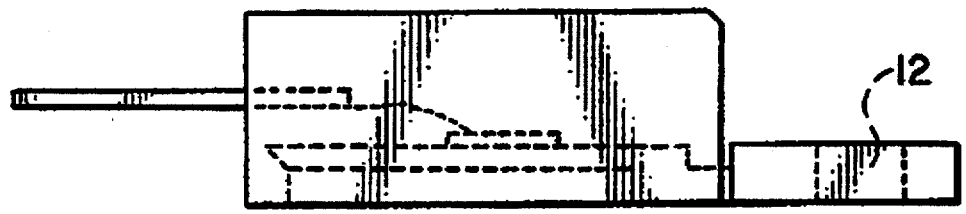

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is cancelled.

Claims 2, 3 and 4 are determined to be patentable as amended.

New claims 5–32 are added and determined to be patentable.

2. A container [as recited in claim 1,] *for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches,* wherein said groove has at least one portion of at least one wall thereof which is undercut *relative to a surface of said plate which is partially encapsulated with resin*.

3. A container [as recited in claim 1,] *for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches* wherein said side notches have at least one portion of their internal walls undercut relative to a surface of said plate which is partially encapsulated with resin.

4. A container as recited in claim [1] *3*, wherein a surface, which is opposite to said body of synthetic resin, of the internal walls of each of said side notches, is substantially a plane surface, which forms an angle which is not greater than a right angle with the plane of said surface of said plate which is partially covered by said synthetic resin, such that said body of synthetic resin projects into said two opposed side notches to the limit of said plane surface opposite to said body of synthetic resin and wholly fills said notches.

5. *A container for a semiconductor device comprising a metal plate and a body of synthetic resin which encapsulates part of said plate so as to keep a surface of said plate exposed, said plate being arranged such that an area of said plate has two opposed side notches and at least one groove that connects said two notches together, each of said notches and groove having at least one common planar wall such that the wall of the groove is substantially aligned with the walls of each of the two opposed side notches and said body of synthetic resin projects into said two opposed side notches and said at least one groove without projecting beyond said walls of said two opposed side notches.*

6. *A container as recited in claim 5, wherein said groove has at least one portion of at least one wall thereof which is undercut relative to a surface of said plate which is partially encapsulated with resin.*

7. *A container as recited in claim 5, wherein said side notches have at least one portion of their internal walls undercut relative to a surface of said plate which is partially encapsulated with resin.*

8. *A container as recited in claim 5, wherein a surface, which is opposite to said body of synthetic resin, of the internal walls of each of said side notches is substantially a plane surface, which forms an angle which is not greater than a right angle with the plane of said surface of said plate which is partially covered by said synthetic resin, such that said body of synthetic resin projects into said two opposed side notches to the limit of said plane surface opposite to said body of synthetic resin and wholly fills said notches.*

9. *A container as recited in claim 5, wherein said plate further includes a partial-thickness extension along at least one portion of the periphery of the part of the plate that is encapsulated by said body of synthetic resin.*

10. *A container for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches, said side notches have at least one portion of their internal wall undercut relative to a surface which is partially encapsulated with synthetic resin, said groove and side notches reducing mechanical stresses caused by mechanical action on said exposed part of the metal plate from being transferred to said encapsulated part of said metal plate.*

11. *A container as recited in claim 10, wherein said body of synthetic resin partially projects into said two opposing side notches and groove leaving at least a portion of said side notches and said groove relative to said exposed part of the metal plate without synthetic resin.*

12. *A container for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches, said side notches and groove having a common wall forming a boundary between the encapsulated part and exposed part of said metal plate to prevent deformations of the exposed part of said plate from detaching the resin from the encapsulated part of said metal plate.*

13. *A container as recited in claim 12, wherein said body of synthetic resin partially projects into said two opposing side notches and groove leaving at least a portion of said* side notches and said groove relative to said exposed part of the metal plate without synthetic resin.

14. A container as recited in claims 10 or 12, wherein said groove has at least one portion of an internal wall undercut relative to a surface of said plate partially encapsulated with resin.

15. A container as recited in claims 10 or 12, wherein said side notches have at least one portion of their internal walls undercut relative to a surface of said plate partially encapsulated with resin.

16. A container for a semiconductor device comprising a metal plate and a body of synthetic resin which encapsulates part of said plate so as to keep a surface of said plate exposed, said plate being arranged such that an area of said plate has two opposed side notches and at lest one groove connecting said two notches together and said body of synthetic resin projects into said two opposed side notches and said at least one groove without projecting beyond said two opposed side notches, the encapsulated part of said plate having an undercut surface in contact with the resin body to facilitate bonding of the resin body to the encapsulated part of said plate.

17. The container of claim 16 wherein the undercut surface comprises an undercut side wall of the groove.

18. The container of claim 17 wherein the undercut surface meets the top surface of said plate entirely within the resin body.

19. The container of claim 16 wherein the undercut surface is one of a plurality of such surfaces.

20. The container of claim 19 wherein the plurality of undercut surfaces comprises undercut side walls of the notches.

21. The container of claim 19 further comprising a rib formed along the edges of said plate and wherein the plurality of undercut surfaces comprises the undersides of said rib.

22. The container of claim 21 wherein the undercut surfaces meet the top surface of said plate and form acute angles therewith.

23. A container for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches, the encapsulated part of said plate having rib elements extending laterally from edges of said plate to facilitate bonding of the resin body to the encapsulated part of said plate.

24. The container of claim 23 wherein the rib elements have portions extending outwardly from three sides of said plate.

25. The container of claim 23 wherein the rib elements have surfaces which are flush with the top surface of said plate.

26. The container of claim 23 wherein the rib elements have surfaces which define an acute angle with the top surface of said plate.

27. The container of claim 23 wherein the rib elements include longitudinal elements on opposite sides of said plate, each of said elements extending along a major portion of the length of the encapsulated part of said plate.

28. The container of claims 2, 3, 5, 10, 12, 16, 23 or 32 wherein the depth of the groove is equal to at least one-third of the thickness of said plate.

29. The container of claims 2, 3, 5, 10, 12, 16, 23 or 32 wherein the interface between the encapsulated and unencapsulated parts of said plate comprises a common wall of the groove and the side notches which is disposed at a right angle to the top surface of said plate.

30. The container of claims 2, 3, 5, 10, 12, 16 or 23 wherein said groove is defined by three flat walls consisting of two opposed side walls and a bottom wall.

31. The container of claims 2, 3, 5, 10, 12, 16 or 23 wherein each of said side notches is defined by three flat walls consisting of two opposed transverse walls disposed at right angles to a longitudinal wall.

32. A container for a semiconductor device comprising a metal plate and a body of synthetic resin which encapsulates part of said plate so as to keep a surface of said plate exposed, said plate being arranged such that an area of said plate has two opposed side notches and at least one groove connecting said two notches together and said body of synthetic resin projects into said two opposed side notches and said at least one groove without projecting beyond said two opposed side notches, wherein said groove has at least one portion of at least one wall thereof which is undercut.

* * * * *